US011430775B2

(12) United States Patent
Chen et al.

(10) Patent No.: US 11,430,775 B2
(45) Date of Patent: Aug. 30, 2022

(54) SEMICONDUCTOR DEVICE WITH EXPOSED INPUT/OUTPUT PAD IN RECESS

(71) Applicant: Yangtze Memory Technologies Co., Ltd., Wuhan (CN)

(72) Inventors: He Chen, Wuhan (CN); Zi Qun Hua, Wuhan (CN); Shu Wu, Wuhan (CN); Yong Qing Wang, Wuhan (CN); Liang Xiao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 106 days.

(21) Appl. No.: 16/596,725

(22) Filed: Oct. 8, 2019

(65) Prior Publication Data

US 2021/0066274 A1    Mar. 4, 2021

Related U.S. Application Data

(63) Continuation of application No. PCT/CN2019/103021, filed on Aug. 28, 2019.

(51) Int. Cl.
*H01L 23/00* (2006.01)
*H01L 25/18* (2006.01)
(Continued)

(52) U.S. Cl.
CPC .......... *H01L 25/18* (2013.01); *H01L 21/6835* (2013.01); *H01L 23/5283* (2013.01); *H01L 24/03* (2013.01); *H01L 24/05* (2013.01); *H01L 24/08* (2013.01); *H01L 27/11526* (2013.01); *H01L 27/11556* (2013.01); *H01L 27/11573* (2013.01); *H01L 27/11582* (2013.01); *H01L 2224/03002* (2013.01); *H01L 2224/0391* (2013.01); *H01L 2224/05567* (2013.01); *H01L 2224/05569* (2013.01); *H01L 2224/05571* (2013.01); *H01L 2224/08147* (2013.01)

(58) Field of Classification Search
CPC .............. H01L 2224/05571; H01L 2224/0391
See application file for complete search history.

(56) References Cited

U.S. PATENT DOCUMENTS 10,354,980 B1    7/2019  Mushiga
10,714,497 B1 *  7/2020  Nishida ............... H01L 23/5226
(Continued)

FOREIGN PATENT DOCUMENTS

CN    104752382 A    7/2015
CN    107293529 A    10/2017
(Continued)

*Primary Examiner* — Daniel Luke
(74) *Attorney, Agent, or Firm* — Winston Hsu (57) ABSTRACT

A semiconductor device and a fabricating method thereof are provided. The semiconductor device includes a semiconductor structure and an input/output pad. The semiconductor structure includes a first substrate and a conductive layer, in which the first substrate has a first surface and a second surface opposite to each other, the conductive layer is disposed on the first surface of the first substrate, and the conductive layer includes one or more first trace. The first semiconductor structure has a recess penetrating the first substrate and exposing the one or more first trace, and the input/output pad is disposed on the one or more first trace and in the recess.

11 Claims, 9 Drawing Sheets

(51) Int. Cl.
*H01L 21/683* (2006.01)
*H01L 23/528* (2006.01)
*H01L 27/11526* (2017.01)
*H01L 27/11556* (2017.01)
*H01L 27/11573* (2017.01)
*H01L 27/11582* (2017.01)

(56) References Cited

U.S. PATENT DOCUMENTS

| | | | |
|---|---|---|---|
| 10,985,169 B2* | 4/2021 | Kai | H01L 24/14 |
| 2015/0364458 A1 | 12/2015 | Ho | |
| 2016/0163732 A1 | 6/2016 | Lim | |
| 2017/0186704 A1* | 6/2017 | Sakuma | H01L 23/562 |
| 2017/0301715 A1 | 10/2017 | Cheng | |
| 2018/0069039 A1 | 3/2018 | Han | |
| 2020/0058669 A1 | 2/2020 | Chen | |
| 2020/0303347 A1* | 9/2020 | Suzuki | H01L 24/05 |

FOREIGN PATENT DOCUMENTS

| | | |
|---|---|---|
| CN | 109155320 A | 1/2019 |
| CN | 109390373 A | 2/2019 |
| TW | 200414483 | 8/2004 |

\* cited by examiner

SEMICONDUCTOR DEVICE WITH EXPOSED INPUT/OUTPUT PAD IN RECESS

CROSS REFERENCE TO RELATED APPLICATIONS

This application is a continuation of International Application No. PCT/CN2019/103021 filed on 2019 Aug. 28, which is incorporated herein by reference in its entirety.

BACKGROUND OF THE INVENTION

1. Field of the Invention

The present invention relates to a semiconductor device and a fabricating method thereof.

2. Description of the Prior Art

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

Figure 1:
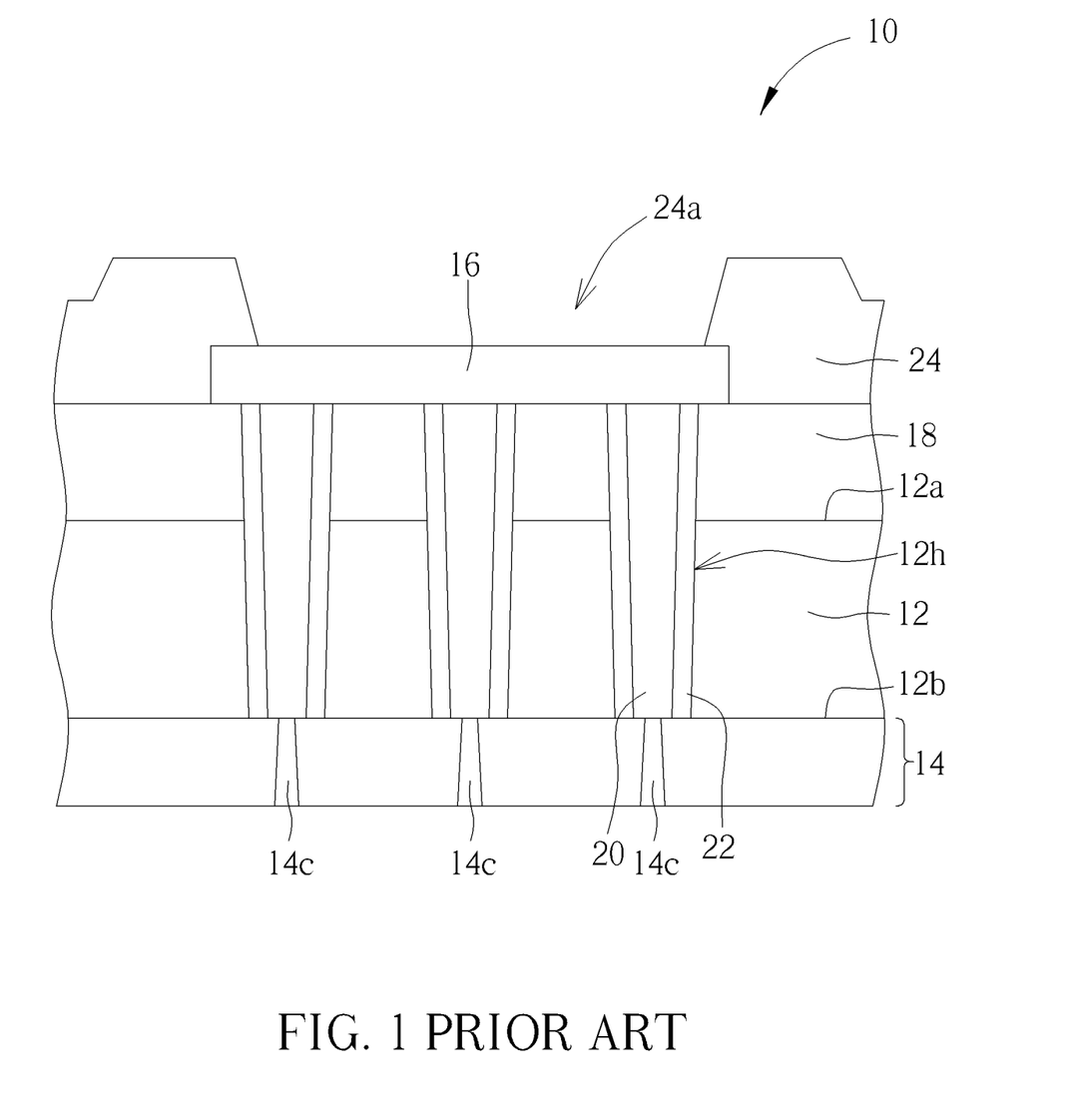
FIG. 1 illustrates an input/output pad structure of a conventional 3D memory device.

A three-dimensional (3D) memory architecture can address the density limitation in planar memory cells. The 3D memory architecture includes a memory array and peripheral devices for controlling signals to and from the memory array device. Refer to FIG. 1 which illustrates an input/output (I/O) pad structure of a conventional 3D memory device. In the I/O pad structure 10 of the conventional 3D memory device, the substrate 12 for forming memory array device 14 may be etched through to form through holes 12h for electrically connecting the memory array device 14 under the substrate 12 to the I/O pad 16 on the substrate 12. In order to form the I/O pad structure 10, an insulating layer 18 is further formed on a surface 12a of the substrate 12 opposite to the memory array device 14, so that the I/O pad 16 formed on the insulating layer 18 can be insulated from the substrate 12 that has some elements, such as doped regions, formed therein. Also, the through holes 12h is formed through the insulating layer 18 and the substrate 12, and a through silicon contact (TSC) 20 and a liner layer 22 are formed in each through hole 12h, in which the liner layer 22 is located between the TSC 20 and the substrate 12 for electrically insulating them from each other. The TSC 20 penetrates through the substrate 12 and electrically connects the I/O pad 16 to a through array contact 14c of the memory array device 14 formed on another surface 12b of the substrate 12 opposite the surface 12a. A passivation layer 24 is formed on the I/O pad 16 and has an opening 24a exposing the I/O pad 16.

However, some shortcomings in the following description are still present in the conventional I/O pad structure 10. First, a parasitic capacitance generated between the I/O pad 16 and the substrate 12 will strongly affect the operating speed of the 3D memory device or the speed for storing or reading data in the 3D memory device, and thus, to reduce the affection, the thickness of the insulating layer 18 may be increased to reduce the parasitic capacitance, but the parasitic capacitance also exists between the TSC 20 and the substrate 12. Second, when the thickness of the insulating layer 18 is increased, for example, to be greater than 1.4 microns, the aspect ratio of each through hole 12h penetrating through the insulating layer 18 and the substrate 12 is increased, thereby significantly enlarging process difficulty. Third, because of the increased thickness of the insulating layer 18, more advanced technologies, such as machines for forming the through holes 12h with larger aspect ratios through the substrate 12, for filling tungsten glue into the through holes 12h with larger aspect ratios, for depositing the liner layer 22 in the through holes 12h with larger aspect ratios, and etc., are required. Thus, the cost of the 3D memory device cannot be further lowered. Third, with the advanced technology, the number of layers of a memory stack needs to be increased. In such situation, the space between two of the through array contacts 14c becomes smaller, such that the opening of each through hole 12h will be smaller, and the space between the TSC 20 and the substrate 12 is reduced, thereby increasing the parasitic capacitance and slowing the operating speed of the 3D memory device. For this reason, different technology generations cannot continuously share the same architecture. Fourth, since the opening of each through hole 12h is limited by the space between two of the through array contacts 14c, the opening of each through hole 12h is small and limited, such that small deviation of through holes 12h generated from the process error may result in open circuit between the through array contact 14c and the I/O pad 16 or current leakage in the memory array device 14.

SUMMARY OF THE INVENTION

Embodiments of a semiconductor device and a fabricating method thereof are described in the present invention.

According to an embodiment of the present invention, a semiconductor device is disclosed. The semiconductor device includes a first semiconductor structure and an input/output pad. The first semiconductor structure includes a first substrate and a conductive layer, in which the first substrate has a first surface and a second surface opposite to each other, the conductive layer is disposed on the first surface of the first substrate, and the conductive layer comprises one or more first trace. The input/output pad disposed on the one or more first trace. The first semiconductor structure has a recess penetrating the first substrate and exposing the one or more first trace, and the input/output pad is disposed in the recess.

In some embodiments, the semiconductor device further includes a first insulating layer disposed on the second surface of the first substrate, and the first insulating layer has an opening corresponding to the recess.

In some embodiments, the first semiconductor structure further includes a second insulating layer between the first surface of the first substrate and the conductive layer, in which the recess penetrates through the second insulating layer.

In some embodiments, a thickness of the input/output pad may be less than a thickness of the second insulating layer.

In some embodiments, the first semiconductor structure further includes a peripheral device on the first substrate.

In some embodiments, the conductive layer further includes at least two second traces electrically connected to the one or more peripheral device.

In some embodiments, the input/output pad directly contacts the one or more first trace.

In some embodiments, a width of the one or more trace is greater than a width of a bottom of the recess.

In some embodiments, the semiconductor device further includes a second semiconductor structure bonded to the first semiconductor structure.

In some embodiments, the second semiconductor structure includes a second substrate and a plurality of NAND strings, and the NAND strings are disposed between the conductive layer and the second substrate.

In some embodiments, the first semiconductor structure further includes one or more peripheral device on the first substrate, and one of NAND strings is electrically connected to the one or more peripheral device.

According to an embodiment of the present invention, a fabricating method of a semiconductor device is disclosed and includes providing a temporary semiconductor structure, wherein the temporary semiconductor structure comprises a temporary substrate and a conductive layer, the temporary substrate has a first surface, the conductive layer is disposed on the first surface of the temporary substrate, and the conductive layer comprises one or more first trace; forming a recess in the temporary semiconductor structure to form a first semiconductor structure and a first substrate, wherein the recess penetrates through the first substrate and expose the one or more first trace; and forming a input/output pad in the recess and on the one or more first trace.

In some embodiments, the fabricating method further includes thinning a surface of the temporary substrate opposite to the first surface to form a second surface between providing the temporary semiconductor structure and forming the recess.

In some embodiments, the fabricating method further includes forming a first insulating layer on the temporary substrate between providing the temporary semiconductor structure and forming the recess, wherein the first insulating layer has an opening exposing the temporary substrate.

In some embodiments, the temporary semiconductor structure further comprises a temporary insulating layer between the first surface of the temporary substrate and the conductive layer, and forming the recess comprises patterning the temporary insulating layer to form a second insulating layer.

In some embodiments, forming the input/output pad includes depositing a conductive material layer on the first insulating layer, a sidewall of the recess, and the one or more first trace, and removing a part of the conductive material layer on the first insulating layer and a sidewall of the recess.

In some embodiments, the input/output pad is directly formed on the one or more first trace.

In some embodiments, providing the first semiconductor structure includes providing the temporary semiconductor structure comprises providing a second semiconductor structure bonded to the temporary semiconductor structure.

Other aspects of the present disclosure can be understood by those skilled in the art in light of the description, the claims, and the drawings of the present disclosure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present invention and, together with the description, further serve to explain the principles of the present invention and to enable a person skilled in the pertinent art to make and use the present invention.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that the present invention can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present invention should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used throughout this application, the word "may" is used in a permissive sense (e.g., meaning having the potential to), rather than the mandatory sense (e.g., meaning must). The words "include", "including", and "includes"

indicate open-ended relationships and therefore mean including, but not limited to. Similarly, the words "have", "having", and "has" also indicated open-ended relationships, and thus mean having, but not limited to. The terms "first", "second", "third," and so forth as used herein are meant as labels to distinguish among different elements and may not necessarily have an ordinal meaning according to their numerical designation.

In the present invention, different technical features in different embodiments described in the following description can be combined, replaced, or mixed with one another to constitute another embodiment.

Figure 2:
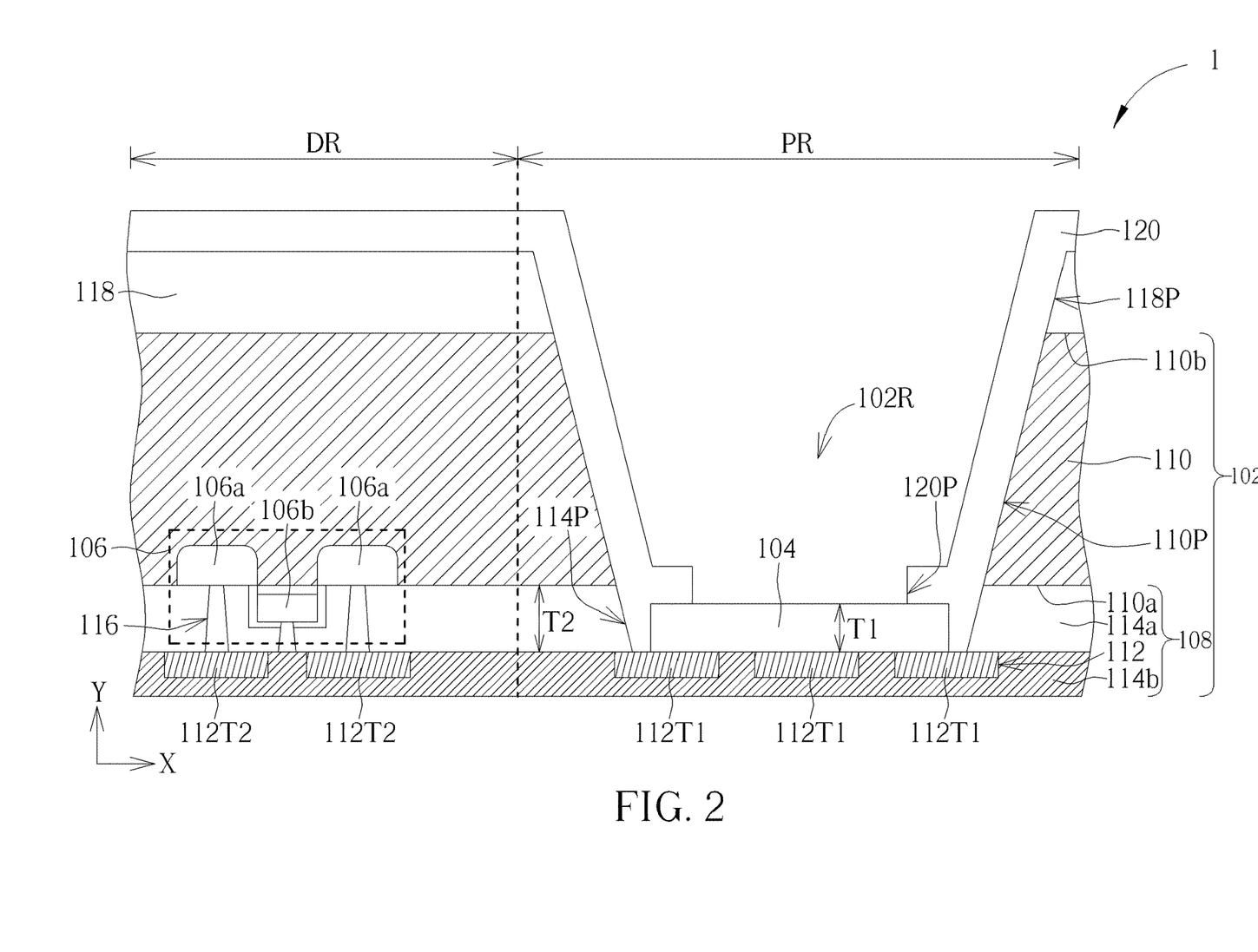
FIG. 2 schematically illustrates a cross-sectional view of an exemplary semiconductor device according to a first embodiment of the present invention.

Refer to FIG. 2 which schematically illustrates a cross-sectional view of an exemplary semiconductor device according to a first embodiment of the present invention. As shown in FIG. 2, the semiconductor device 1 provided in this embodiment includes a first semiconductor structure 102 and an input/output (I/O) pad 104, in which the first semiconductor structure 102 has a recess 102R for disposing the I/O pad 104 that is electrically connected to external circuits or devices to transfer electrical signals between the semiconductor device 1 and the external circuits or devices. In FIG. 2, one I/O pad 104 is illustrated, but the number of the I/O pad 104 of the present invention is not limited to this and may be plural. In this embodiment, the first semiconductor structure 102 includes a first substrate 110 and one or more conductive layer 112, in which the first substrate 110 has a first surface 110a and the second surface 110b opposite to each other, and the conductive layer 112 is disposed on the first surface 110a of the first substrate 110. The conductive layer 112 may include one or more first trace 112T1 exposed by the recess 102R, and the I/O pad 104 is disposed on and electrically connected to the first trace 112T1. By means of disposing the I/O pad 104 in the recess 102R, the parasitic capacitance generated between the I/O pad 104 and the first substrate 110 can be reduced. The first semiconductor structure 102 may for example be a peripheral device structure, so the first semiconductor structure 102 may include the first substrate 110 and a peripheral interconnect layer 108 on the first surface 110a of the first substrate 110, and the conductive layer 112 is included in the peripheral interconnect layer 108. The first semiconductor structure 102 may further include a peripheral device 106 on the first surface 110a of the first substrate 110 and between the peripheral interconnect layer 108 and the first substrate 110. The first substrate 110 for example can include silicon (e.g., single crystalline silicon), silicon germanium (SiGe), gallium arsenide (GaAs), germanium (Ge), silicon on insulator (SOI), or any other suitable materials. The conductive layer 112 may for example include conductor materials including, but not limited to, W, Co, Cu, Al, silicides, or any combination thereof.

It is noted that X and Y axes are added in FIG. 2 to further illustrate the spatial relationship of the components in semiconductor device 1. The first substrate 110 includes two lateral surfaces (e.g., the first surface 110a and the second surface 110b) extending laterally in a direction X (the lateral direction or width direction). As used herein, one component (e.g., a layer or a device) is "on", "above", or "under" another component (e.g., a layer or a device) of the semiconductor device is determined relative to the substrate of the semiconductor device (e.g., the first substrate 110) in another direction Y (the vertical direction or thickness direction). The same notion for describing spatial relationship is applied throughout the present disclosure.

In this embodiment, the first substrate 110 may have a device region DR and a pad region PR. The device region DR is for forming the peripheral device 106, and the pad region PR is for forming the recess 102R and the I/O pad 104, such that the peripheral device 106 is not affected or damaged by the formation of the recess 102R and the I/O pad 104. Thus, the first substrate 110 can be etched through to have an opening 110P corresponding to the recess 102R.

The peripheral device 106 may include one or more transistor. In the embodiment shown in FIG. 2, one transistor is illustrated as an example, but not limited thereto. The peripheral device 106 may for example include doped regions 106a and a gate structure 106b. The doped regions 106a are disposed in the first substrate 110. The gate structure 106b may be disposed between the first substrate 110 and the peripheral interconnect layer 108.

The peripheral interconnect layer 108 includes the conductive layer 112 and one or more insulating layer, such that the peripheral device 106 may be electrically connected to the I/O pad 104 or other devices, such as following memory array device. In the embodiment shown in FIG. 2, one conductive layer 112 and two insulating layers 114a, 114b are illustrated as an example, but not limited thereto. Each of the insulating layers 114a, 114b can include dielectric materials, such as silicon oxide, silicon nitride, silicon oxynitride, any other suitable dielectric materials, or any combination thereof. The conductive layer 112 is disposed on the first surface 110a of the first substrate 110 and between the insulating layers 114a, 114b, and the insulating layer 114a is disposed between the conductive layer 112 and the first substrate 110, such that some parts of the conductive layer 112 may be electrically isolated from the first substrate 110 by the insulating layer 114a.

In this embodiment, the recess 102R further penetrates the insulating layer 114a between the first substrate 110 and the conductive layer 112 and exposes the first trace 112T1, such that the insulating layer 114a has an opening 114P corresponding to the recess 102R. For example, the opening 110P, the opening 114P, the exposed first trace 112T1 and a part of the insulating layer 114b may form the recess 102R.

Furthermore, the semiconductor device 1 may further include another insulating layer 118 disposed on the second surface 110b of the first substrate 110, in which the insulating layer 118 has an opening 118P corresponding to the recess 102R. In other words, the opening 118P exposes the recess 102R. Thus, the I/O pad 104 can be formed on the conductive layer 112 through the opening 118P and the recess 102R and electrically connected to the exposed first trace 112T1 by being disposed in the recess 102R. For example, the I/O pad 104 can directly contact the first trace 112T1. In the embodiment shown in FIG. 2, the number of the exposed first traces 112T1 spaced apart from each other is plural, and the I/O pad 104 is electrically connected to the plural first traces 112T1, but not limited thereto. In some embodiments, the number of the exposed first trace 112T1 may be one, and a width of the first trace 112T1 may be the same as or different from a width of a bottom of the recess 102R. Preferably, the width of the first trace 112T1 may be greater than the width of the bottom of the recess 102R, so the first trace 112T1 may serve as an etching stop layer while forming the recess 102R. In some embodiments, the conductive layer 112 may be one of the conductive layers in the peripheral interconnect layer 108 closest to the first substrate 110, but not limited thereto. In some embodiments, the conductive layer 112 may further include at least two second traces 112T2 electrically connected to the peripheral device 106. In some embodiments, the number of the insulating layers penetrated by the recess 102R may be plural. In some embodiments, the thickness T1 of the conductive layer 112 may be less than the thickness T2 of the insulating layer 114a, such that the space between the conductive layer 112 and the first substrate 110 can be increased to lower the parasitic capacitance between them.

In some embodiments, the peripheral interconnect layer 108 may further include at least one contact layer 116 for electrically connecting the peripheral device 106 to the conductive layer 112. For example, the contact layer 116 includes contact plugs penetrate through the insulating layer 114a. In some embodiments, the peripheral interconnect layer 108 may further include contact layer under the conductive layer 112, but not limited thereto. The conductive layer 116 may for example include conductor materials including, but not limited to, W, Co, Cu, Al, silicides, or any combination thereof.

In some embodiments, the semiconductor device 1 may further include a passivation layer 120 for protecting the insulating layer 118, the first semiconductor structure 102 and the I/O pad 104. The passivation layer 120 has an opening 120P exposing the I/O pad 104, so that the I/O pad 104 can be electrically connected to external circuits or devices through the opening 120P.

Figure 3:
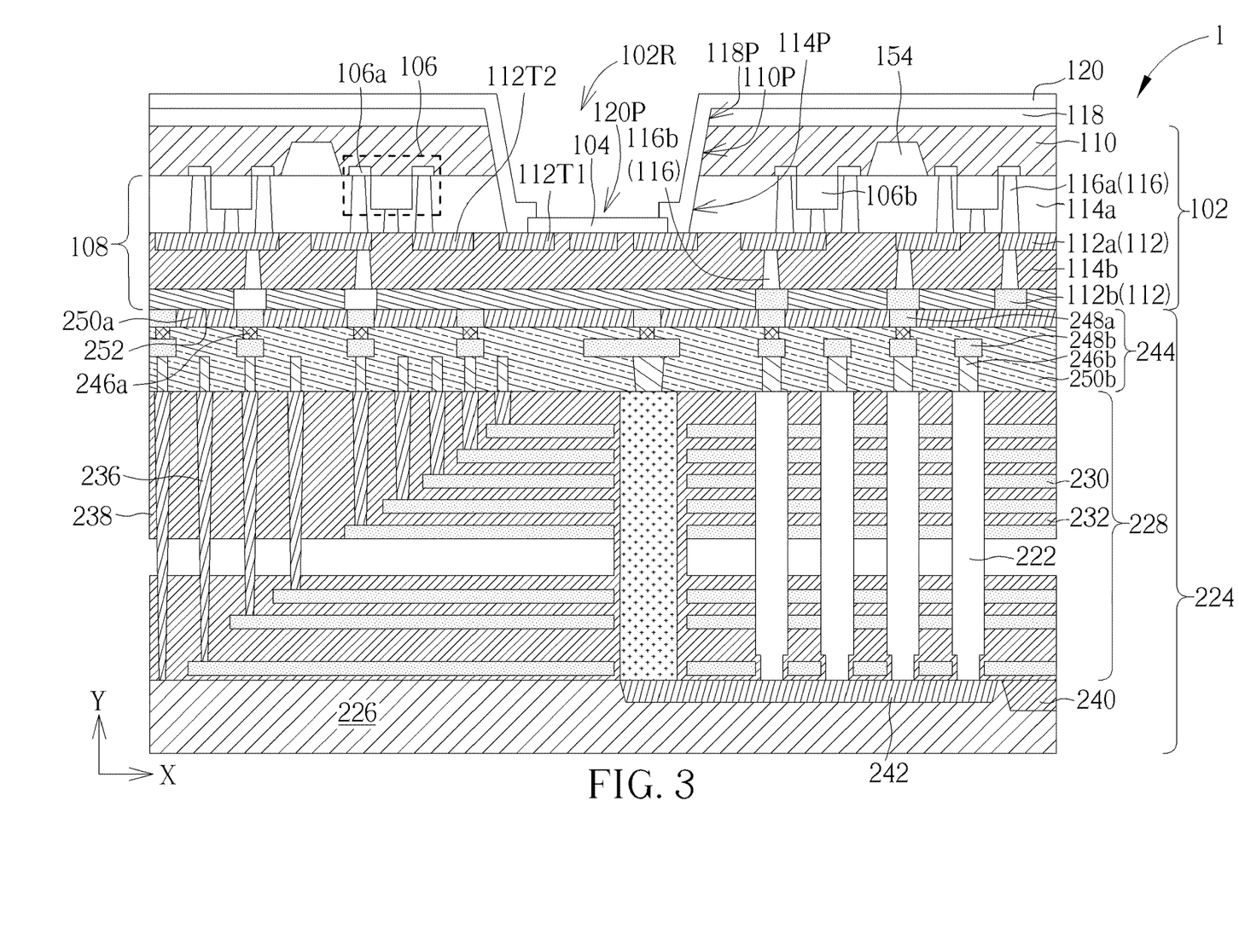
FIG. 3 schematically illustrates a cross-sectional view of the semiconductor device according to an example of the first embodiment of the present invention.

The semiconductor device may for example be a memory device or any other suitable device. Refer to FIG. 3 which schematically illustrates a cross-sectional view of the semiconductor device according to an example of the first embodiment of the present invention. As shown in FIG. 3, the semiconductor device 1 provided in this example is a NAND Flash memory device, but not limited thereto. The memory cells in the NAND Flash memory device are provided in the form of a plurality of NAND strings 222 extending vertically under the first substrate 110. In this example, the semiconductor device 1 may further include a second semiconductor structure 224, and the second semiconductor structure 224 includes a second substrate 226 and a memory array device 228. The second substrate 226 is disposed opposite to the first surface 110a of the first substrate 110, and the memory array device 228 is formed on the second substrate 226 and between the first substrate 110 and the second substrate 226. The second substrate 226 for example can include silicon (e.g., single crystalline silicon), silicon germanium (SiGe), gallium arsenide (GaAs), germanium (Ge), silicon on insulator (SOI), or any other suitable materials.

The memory array device 228 can include the NAND strings 222 disposed between the conductive layer 112 and the second substrate 226. The NAND strings 222 extend vertically through a plurality of conductor layers 230 and a plurality of dielectric layers 232. Each conductor layer 230 and a corresponding one of the dielectric layers 232 may form a pair. Each conductor layer 230 can be adjoined by two dielectric layers 232 on both sides, and each dielectric layer 232 can be adjoined by two conductor layers 230 on both sides. Conductor layer 230 can include conductor materials, such as tungsten (W), cobalt (Co), copper (Cu), aluminum (Al), doped silicon, silicides, any other suitable conductor materials, or any combination thereof. Dielectric layer 232 can include dielectric materials, such as silicon oxide, silicon nitride, silicon oxynitride, any other suitable dielectric materials, or any combination thereof. Also, the memory array device 228 may further include a source contact 234, word line contacts 236, and a dielectric layer 238, in which the source contact 234 extends vertically through the conductor layers 230 and the dielectric layers 232, the word line contacts 236 extend vertically within the dielectric layer 238, and each word line contact 236 is in contact with a corresponding conductor layer 230 to individually address a corresponding word line of the memory array device 228. It is noted that the memory array device 228 shown in FIG. 2 is for an example, and the person skilled in the art knows the memory array device 228 may have other structures, so the structure or its variant of the memory array device 228 will not be detailed herein. In some embodiments, an isolation region 240 and a doped region 242 may be formed in the second substrate 226.

As shown in FIG. 2, the semiconductor device 1 may further include an array interconnect layer 244 for electrically connecting the memory array device 228 to the peripheral device 106 and/or the I/O pad 104. For example, one of NAND strings 222 is electrically connected to the peripheral device 106 through the array interconnect layer 244 and the peripheral interconnect layer 108. The array interconnect layer 244 is disposed on the memory array device 228 and in contact with the peripheral interconnect layer 108. The array interconnect layer 244 can include one or more contact layer (e.g. contact layers 246a, 246b), one or more conductive layer (e.g. conductive layers 248a, 248b), and one or more dielectric layer (e.g. dielectric layers 250a, 250b). The contact layers 246a, 246b and the conductive layers 248a, 248b may include conductor materials including, but not limited to, W, Co, Cu, Al, silicides, or any combination thereof. The dielectric layers 250a, 250b may include dielectric materials including, but not limited to, silicon oxide, silicon nitride, low-k dielectrics, or any combination thereof.

In this example, the peripheral interconnect layer 108 may include plural conductive layers 112 (e.g. conductive layers 112a, 112b), plural contact layers 116 (e.g. contact layers 116a, 116b), and plural dielectric layers (e.g. dielectric layers 114a, 114b, 114c). In some embodiments, the number of the contact layer 116 and the number of the dielectric layer are not limited to be plural and may be adjusted based on the number of the conductive layer 112. A bonding interface 252 may be formed between the dielectric layer 114c of the peripheral interconnect layer 108 and the dielectric layer 250a of the array interconnect layer 244. The bonding interface 252 may also be formed between the conductor layer 248a of the array interconnect layer 244 and the conductor layer 112b of the peripheral interconnect layer 108. In other words, the first semiconductor structure 102 is bonded to the second semiconductor structure 224 at the bonding interface 252. In some embodiments, the first semiconductor structure 102 may further include isolation regions 154 formed in the first substrate 110 for separating different components.

As mentioned above, the semiconductor device 1 may have the following advantages as compared with the conventional memory device shown in FIG. 1. First, since the I/O pad 104 is directly disposed in the recess 102R, the I/O pad 104 doesn't exist in the opening 110P of the first substrate 110. Thus, the parasitic capacitance generated between the I/O pad 104 and the first substrate 110 can be reduced, thereby improving the operating speed of the semiconductor device 1 or the speed for storing or reading data in the semiconductor device 1. Second, the thickness of the insulating layer 118 is not required to be increased to reduce the parasitic capacitance, such that the cost for forming the insulating layer 118 can be lowered, and high aspect ratio is not required. Thus, the formation of the I/O pad 104 is not limited by the high aspect ratio of the through hole penetrating the insulating layer and the substrate, and the process difficulty for forming the I/O pad 104 can be easier when the density of the NAND strings 22 is increased. Third, because the recess 102R is formed on the first semiconductor structure 108 including the peripheral device 106, the width of the recess 102R (e.g. in a range from 70 µm to 80 µm) is not limited to be similar to or the same as the width of the NAND string 222 or TSC, exposure light used in a photolithography process is not limited to have very small wavelength. For example, the photolithographic process for forming the recess 102R may use I-line exposure (e.g. 365 nm). Since that, open circuit between the through array contact and the I/O pad or current leakage in the semiconductor device due to the process error will not occur. For this reason, more advanced technologies, such as machines for forming the through holes with larger aspect ratios through the substrate, for filling tungsten glue into the through holes with larger aspect ratios, for depositing the liner layer in the through holes with larger aspect ratios, and etc., are not required. Fourth, when the number of conductor layers 230 and the dielectric layers 232 are increased to upgrade memory capacity, different technology generations still can easily share the same semiconductor device 1.

Figure 4:
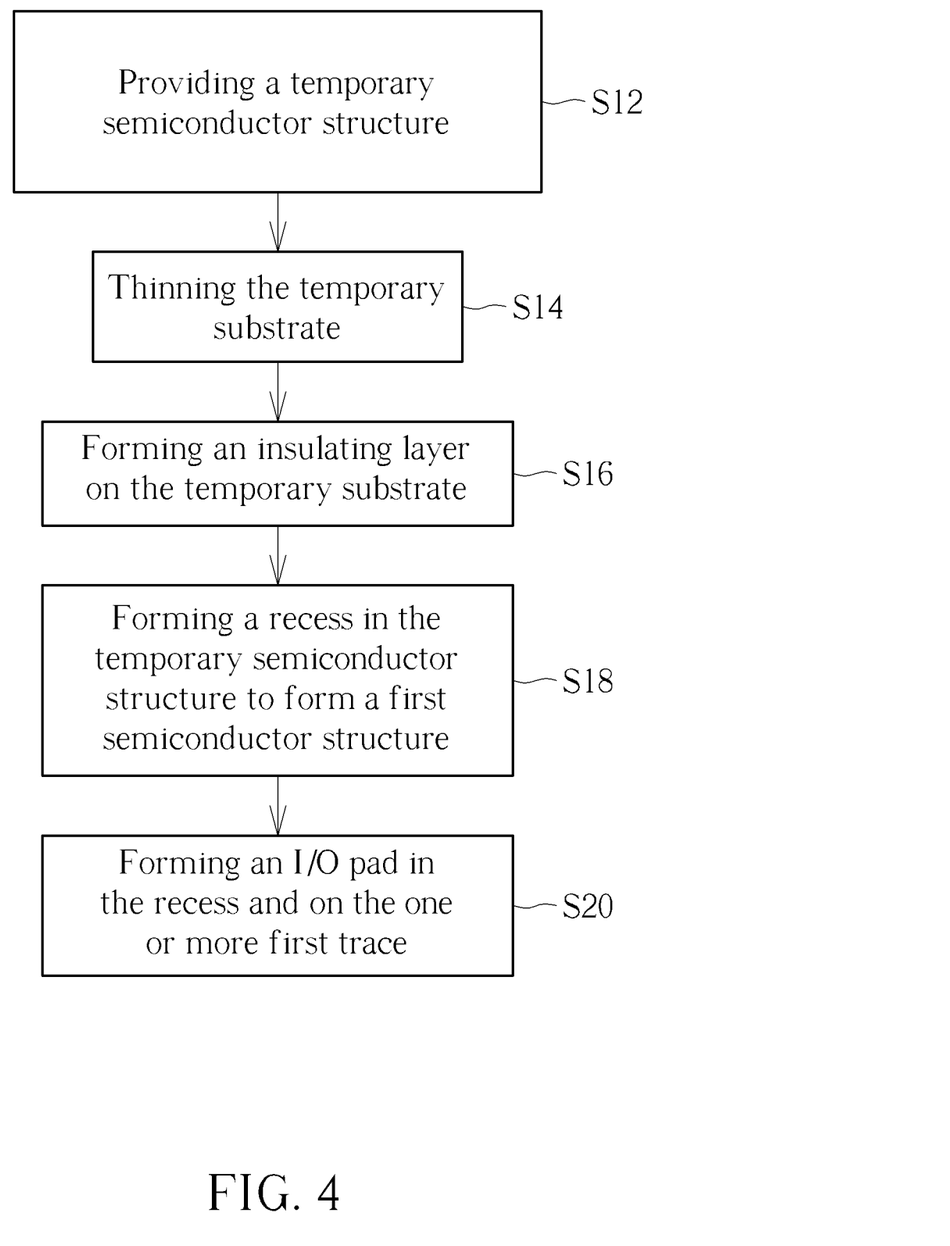
FIG. 4 is a flowchart of an exemplary fabricating method of the semiconductor device according to the first embodiment of the present invention.
Figure 5:
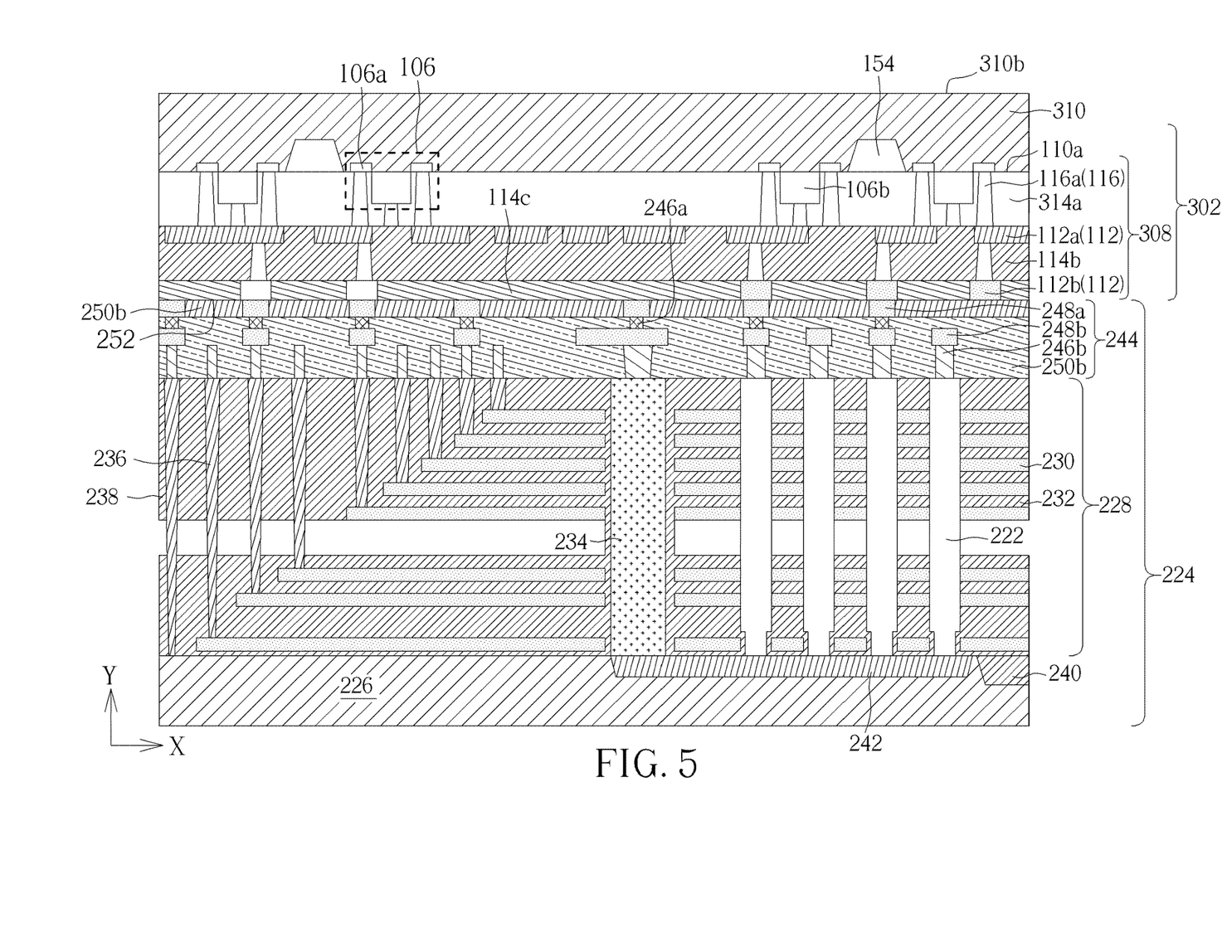
FIG. 5 to FIG. 8 schematically illustrate exemplary fabrication steps of the semiconductor device.

FIG. 4 is a flowchart of an exemplary fabricating method of the semiconductor device according to the first embodiment of the present invention. FIG. 5 to FIG. 8 and FIG. 2 schematically illustrate exemplary fabrication steps of the semiconductor device, in which for clarity, FIG. 6 to FIG. 8 ignore a part of the first semiconductor structure and the second semiconductor structure, but the present invention is not limited thereto. It should be noted that the steps shown in FIG. 4 are not exhaustive and that other steps may be performed as well before, after, or between any of the illustrated steps. The fabricating method of the semiconductor device 1 provided in this embodiment includes the following steps S12-S20. As shown in FIG. 4 and FIG. 5, the step S12 is performed to provide a temporary semiconductor structure 302. The temporary semiconductor structure 302 includes a temporary substrate 310, a temporary insulating layer 314a and one or more conductive layer 112. The temporary semiconductor structure 302 is different from the first semiconductor structure 102 in that the temporary substrate 310 of the semiconductor structure 302 is not thinned and etched through in step S12, so the temporary semiconductor structure 302 doesn't have the recess 102R, and the temporary substrate 310 doesn't have the opening 110P. In some embodiments, the thickness of the temporary substrate 310 may be greater than that of the first substrate 110 in step S12. In this embodiment, the temporary substrate 310 has a first surface 110a and a third surface 310b opposite to each other, the temporary peripheral interconnect layer 308 and the peripheral device 106 are formed on the first surface 110a of the temporary substrate 310. In step S12, the temporary peripheral interconnect layer 308 is different from the peripheral interconnect layer 108 mentioned above in that the temporary insulating layer 314a is not etched through, so as not to have the opening 114P. In this embodiment, the peripheral device 106 is similar to or the same as the mentioned above and will not be detailed redundantly.

In step S12, the second semiconductor structure 224 is also provided and bonded to the temporary semiconductor structure 302. Since the second semiconductor structure 224 is the same as the mentioned above, the second semiconductor structure 224 will not be detailed repeatedly.

Figure 6:
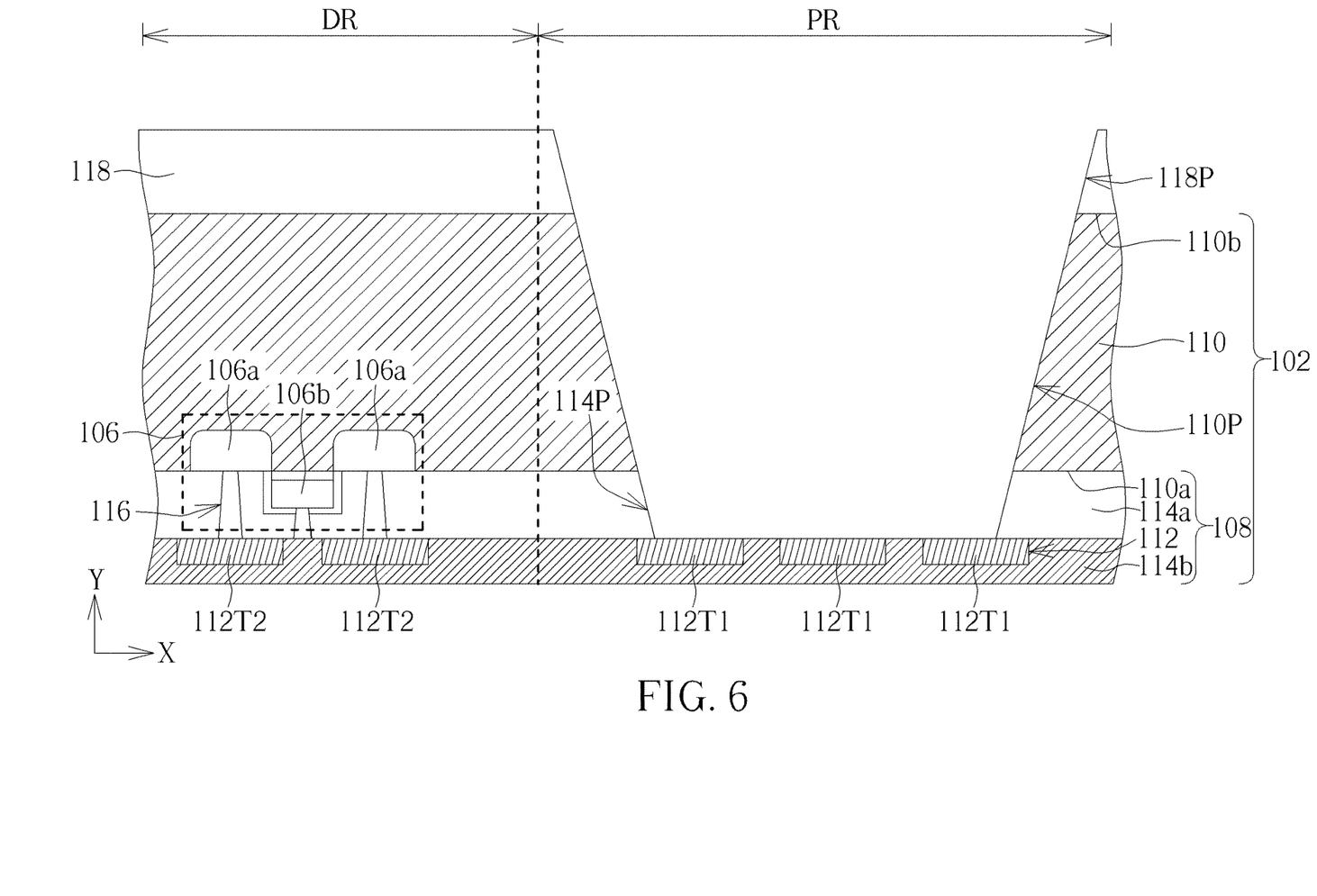

As shown in FIG. 4, FIG. 5 and FIG. 6, the step S14 is optionally performed to thin the third surface 310b of the temporary substrate 310 to form a second surface 110b. For example, thinning the first substrate 310 may include performing a chemical mechanical planarization (CMP) process or any other suitable process.

After thinning the temporary substrate 310, the step S16 is performed to form an insulating layer 118 on the second surface 110b of the thinned temporary substrate 310, in which the insulating layer 118 has the opening 118P exposing the second surface 110b of the temporary substrate 310. For example, forming the insulating layer 118 may include depositing an insulating material layer and patterning the insulating material layer. The deposition of the insulating material layer may for example utilize a chemical vapor deposition (CVD) process, a physical vapor deposition (PVD) process, an atomic layer deposition (ALD) process or any other suitable deposition process. The patterning of the insulating material layer may for example utilize a photolithographic process using a photomask (such as I-line mask). In some embodiments, the step S16 may be performed directly after providing the temporary semiconductor structure 302.

After forming the insulating layer 118, the step S18 is performed to forming the recess 102R in the pad region PR of the temporary semiconductor structure 302. Specifically, forming the recess 102R may include patterning the exposed temporary substrate 310 to form the opening 110P in the temporary substrate 310, thereby forming the aforementioned first substrate 110 with the opening 110P. The patterning of the temporary substrate 310 may for example utilize an etching process using the insulating layer 118 as a mask. Forming the recess 102R may further include patterning a part of the temporary insulating layer 314a exposed by the opening 110P to form the opening 114P and expose the first traces 112T1 after forming the opening 110P, thereby forming the aforementioned insulating layer 114a with the opening 114P. Accordingly, the first semiconductor structure 102 mentioned above can be formed, and the peripheral interconnect layer 108 mentioned above can be formed. The patterning of the temporary insulating layer 314a may for example utilize an etching process selectively etching the temporary insulating layer 314a relative to the insulating layer 118, the first substrate 110 and the conductive layer 112. In some embodiments, the peripheral interconnect layer 308 may further include an etching stop layer between the conductive layer 112 and the temporary insulating layer 314a, so that the etching of the temporary insulating layer 314a can be stopped at the etching stop layer, and the insulating layer 114b between the first traces 112T1 can be protected. In some embodiment, the etching process may have high etching selectivity of the temporary insulating layer 314a relative to the insulating layer 114b.

Figure 7:
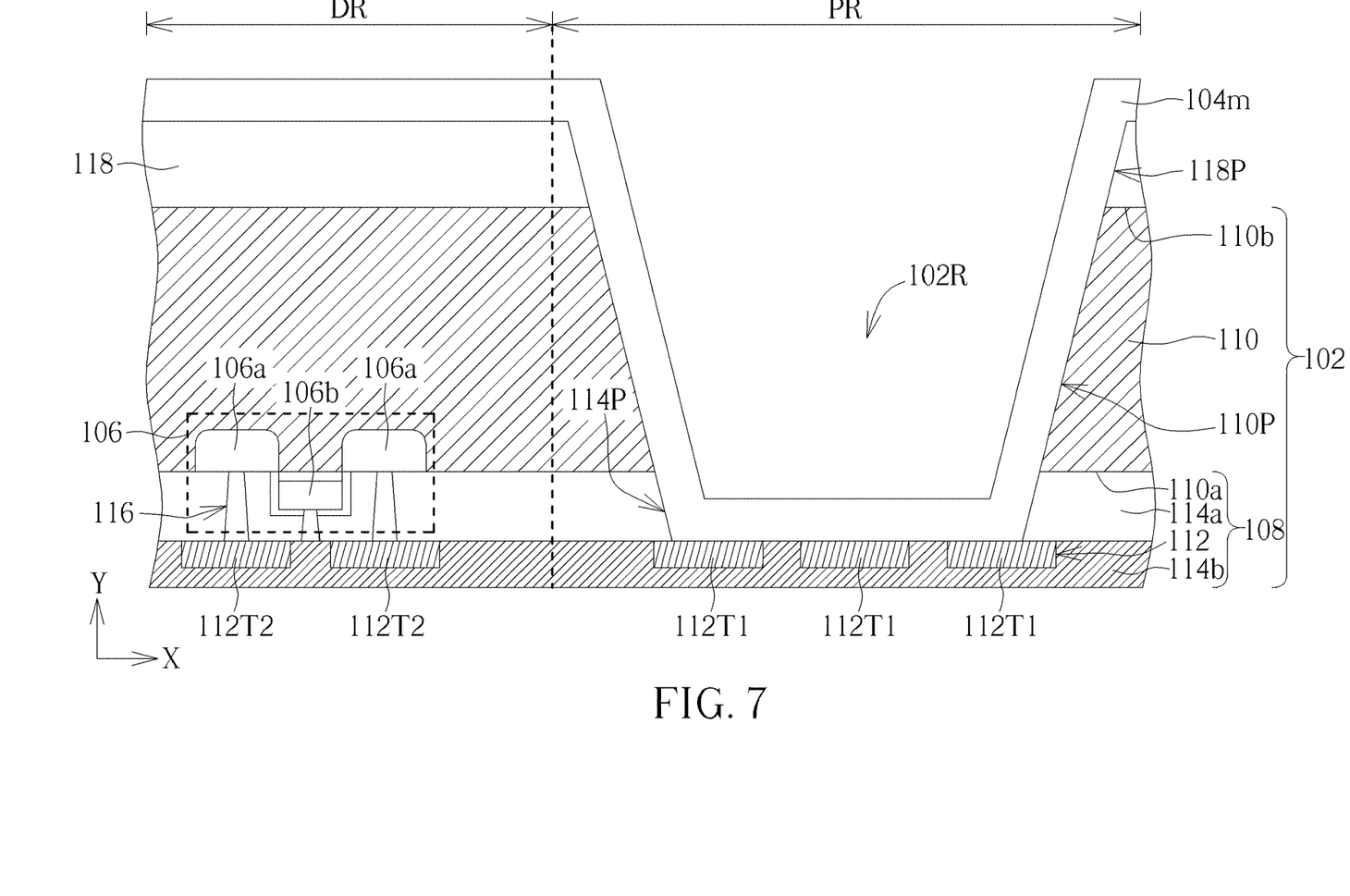
Figure 8:
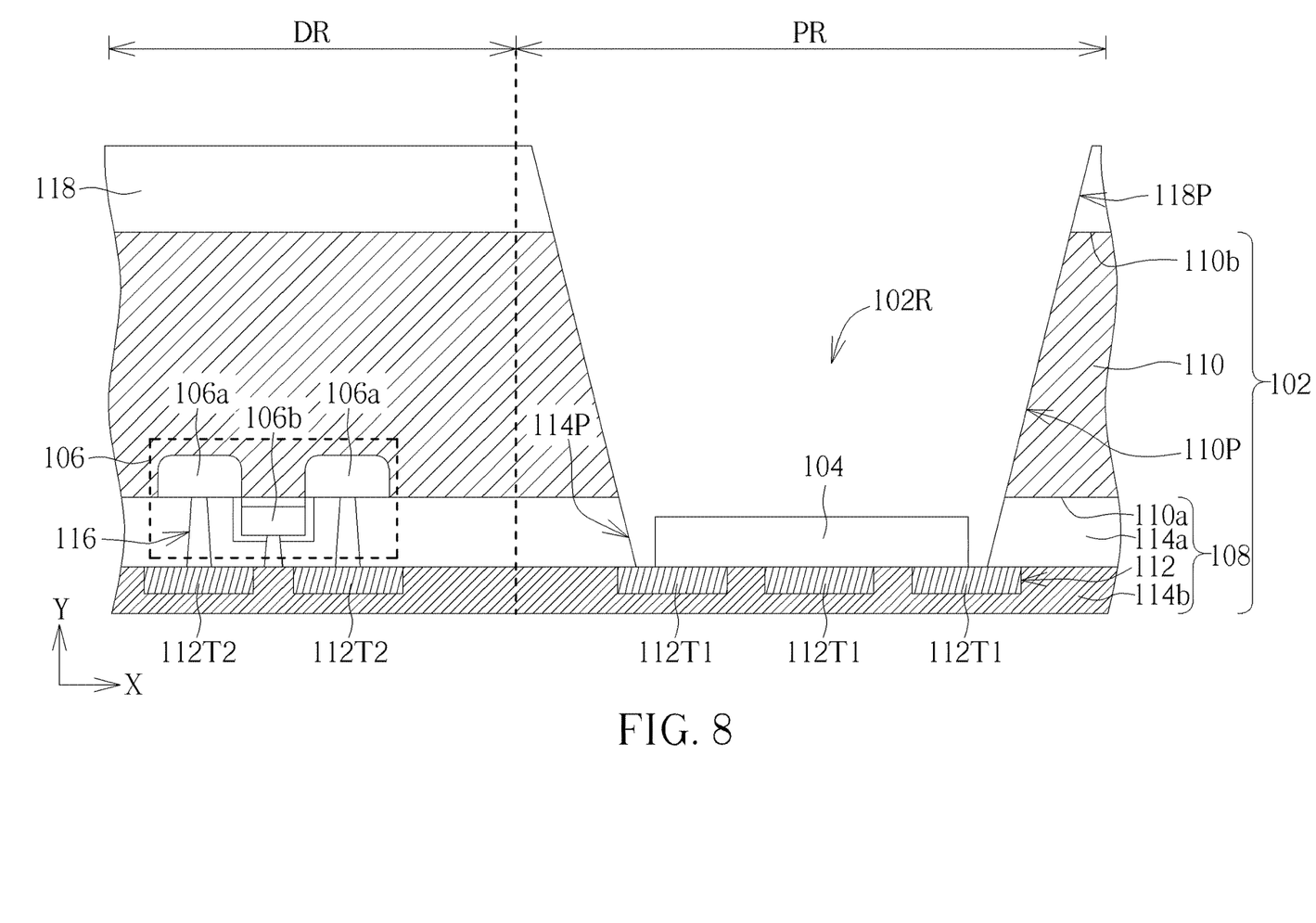

As shown in FIG. 4 and FIG. 8, the step S20 is performed to form an I/O pad 104 in the recess 102R and on the first trace 112T1. Specifically, as shown in FIG. 7, forming the I/O pad 104 includes depositing a conductive material layer 104m on the insulating layer 118, a sidewall of the recess 102R, and the first trace 112T1. In other words, the conductive material layer 104m extend from the top surface of the insulating layer 118 onto sidewalls of the opening 118P, sidewalls of the opening 110P, sidewalls of the opening 114P and the I/O pad 104. The deposition of the conductive material layer 104m may use the CVD process, the PVD process, the ALD process or any other suitable deposition process. Subsequently, as shown in FIG. 8, forming the I/O pad 104 further includes patterning the conductive material layer 104m to remove parts of the conductive material layer 104m on the insulating layer 118 and sidewalls of the recess 102R.

As shown in FIG. 2, after the I/O pad 104 is formed, a passivation layer 120 may be further formed on the insulating layer 118, sidewalls of the opening 110P, sidewalls of the opening 114P and the I/O pad 104, and then, the passivation layer 120 is patterned to have an opening 120P exposing the I/O pad 104. Accordingly, the semiconductor device 1 of this embodiment is formed.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 9:
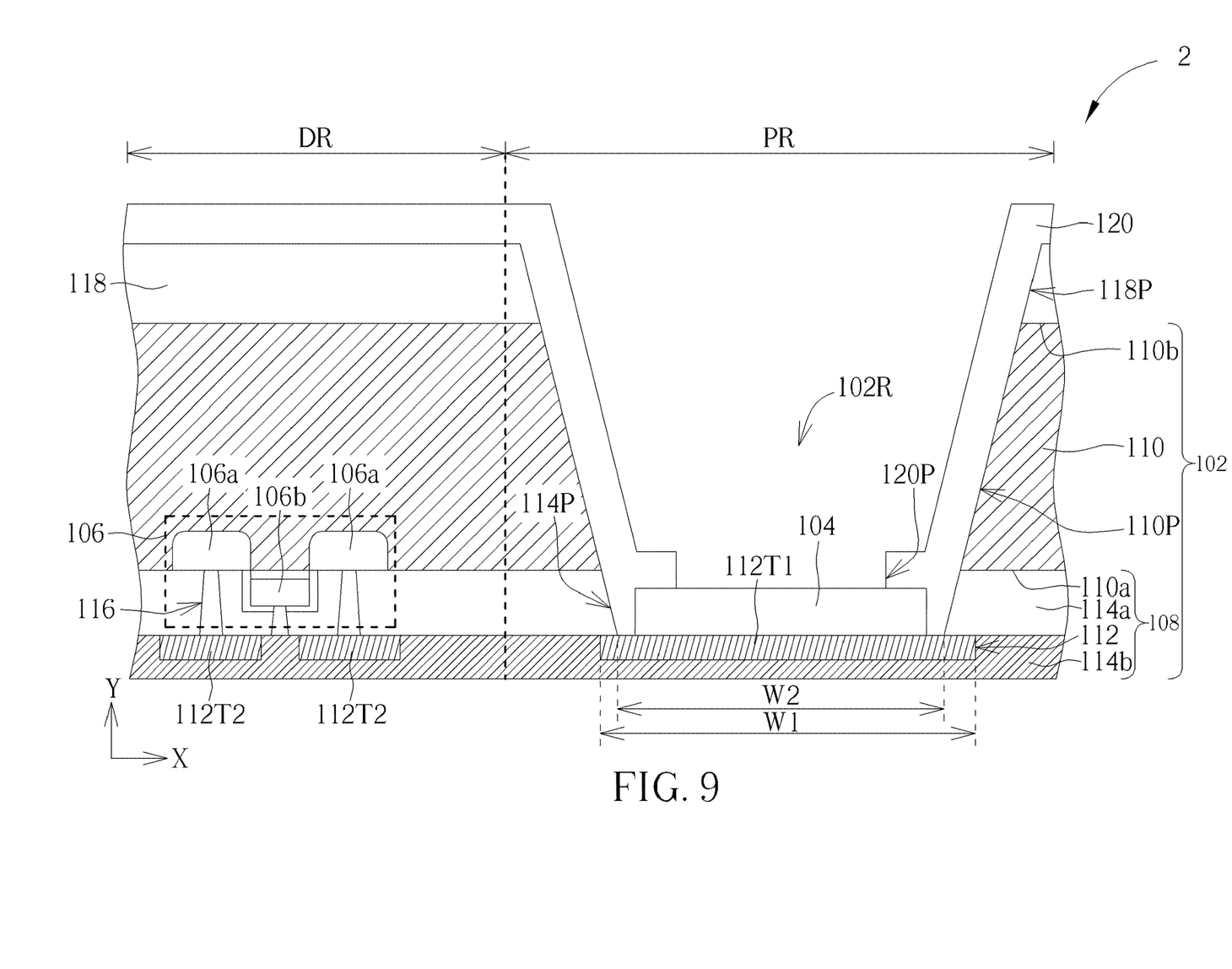
FIG. 9 schematically illustrates an exemplary semiconductor device according to a second embodiment of the present invention.

Refer to FIG. 9 which schematically illustrates an exemplary semiconductor device according to a second embodiment of the present invention. As shown in FIG. 9, the semiconductor device 2 provided in this embodiment is different from the previous embodiment in that a width W1 of the first trace 112T1 may be the greater a width W2 of a bottom of the recess 102R, so the first trace 112T1 may serve as an etching stop layer while forming the recess 102R.

By using the disclosed semiconductor device and fabricating method thereof, the parasitic capacitance generated between the I/O pad and the first substrate can be reduced, thereby improving the operating speed of the memory device or the speed for storing or reading data in the memory device. Also, the thickness of the insulating layer on the first substrate is not required to be increased to reduce the parasitic capacitance, such that the cost for forming the insulating layer can be lowered, and high aspect ratio is not required. Thus, the formation of the I/O pad is not limited by the high aspect ratio, and the process difficulty for forming the I/O pad can be easier when the density of the NAND strings is increased. Because the recess is formed on the first semiconductor structure including the peripheral device, the width of the recess of the first semiconductor structure is not limited to be similar to or the same as the width of the NAND string or TSC, exposure light used in the photolithography process can have larger wavelength. Also, open circuit between the through array contact and the I/O pad or current leakage in the semiconductor device due to the process error will not occur, and more advanced technologies are not required. Furthermore, when the number of conductor layers and the dielectric layers are increased to upgrade memory capacity, different technology generations still can easily use the same architecture.

The foregoing description of the specific embodiments will so fully reveal the general nature of the present invention that others can, by applying knowledge within the skill of the art, readily modify and/or adapt, for various applications, such specific embodiments, without undue experimentation, and without departing from the general concept of the present invention. Therefore, such adaptations and modifications are intended to be within the meaning and range of equivalents of the disclosed embodiments, based on the invention and guidance presented herein. It is to be understood that the phraseology or terminology herein is for the purpose of description and not of limitation, such that the terminology or phraseology of the present specification is to be interpreted by the skilled artisan in light of the invention and guidance.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present invention as contemplated by the inventor(s), and thus, are not intended to limit the present invention and the appended claims in any way.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a first semiconductor structure, comprising a first substrate, a conductive layer, and two peripheral devices, wherein the first substrate has a first surface and a second surface opposite to each other, the conductive layer is disposed on the first surface of the first substrate, the conductive layer comprises one or more first trace, and the peripheral devices are disposed on the first surface of the first substrate;
an input/output pad disposed on the one or more first trace; and
a first insulating layer and a passivation layer sequentially disposed on the second surface of the first substrate;
wherein the first semiconductor structure has a recess penetrating the first substrate and exposing the one or more first trace, the recess is disposed between the peripheral devices, and the input/output pad is disposed in the recess, and
wherein the first insulating layer has an opening corresponding to the recess, and the passivation layer extends into the recess and is in contact with the input/output pad.

2. The semiconductor device according to claim 1, further comprising a first insulating layer disposed on the second surface of the first substrate, wherein the first insulating layer has an opening corresponding to the recess.

3. The semiconductor device according to claim 1, wherein the first semiconductor structure further comprises a second insulating layer between the first surface of the first substrate and the conductive layer, wherein the recess penetrates through the second insulating layer.

4. The semiconductor device according to claim 3, wherein a thickness of the input/output pad is less than a thickness of the second insulating layer.

5. The semiconductor device according to claim 1, wherein the conductive layer further comprises at least two second traces electrically connected to one of the peripheral devices.

6. The semiconductor device according to claim 1, wherein the input/output pad directly contacts the one or more first trace.

7. The semiconductor device according to claim 1, wherein a width of the one or more first trace is greater than a width of a bottom of the recess.

8. The semiconductor device according to claim 1, further comprising a second semiconductor structure bonded to the first semiconductor structure.

9. The semiconductor device according to claim 8, wherein the second semiconductor structure comprises a second substrate and a plurality of NAND strings, and the NAND strings are disposed between the conductive layer and the second substrate.

10. The semiconductor device according to claim 9, wherein one of the NAND strings is electrically connected to one of the peripheral devices.

11. The semiconductor device according to claim 9, wherein the second semiconductor structure further comprises a plurality of word line contacts, the word line contacts are disposed between the conductive layer and the second substrate, one of the peripheral devices is electrically connected to one of the NAND strings, and another one of the peripheral devices is electrically connected to one of the word line contacts.

* * * * *